United States Patent
Matsuura

(10) Patent No.: US 10,886,146 B2
(45) Date of Patent: Jan. 5, 2021

(54) COPPER FOIL WITH CARRIER, PRODUCTION METHOD FOR SAME, PRODUCTION METHOD FOR CORELESS SUPPORT WITH WIRING LAYER, AND PRODUCTION METHOD FOR PRINTED CIRCUIT BOARD

(71) Applicant: MITSUI MINING & SMELTING CO., LTD., Tokyo (JP)

(72) Inventor: Yoshinori Matsuura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 105 days.

(21) Appl. No.: 16/080,425

(22) PCT Filed: Feb. 21, 2017

(86) PCT No.: PCT/JP2017/006422
§ 371 (c)(1),
(2) Date: Aug. 28, 2018

(87) PCT Pub. No.: WO2017/150283
PCT Pub. Date: Sep. 8, 2017

(65) Prior Publication Data
US 2019/0013212 A1    Jan. 10, 2019

(30) Foreign Application Priority Data

Feb. 29, 2016   (JP) .................................. 2016-037307

(51) Int. Cl.
B21C 37/00    (2006.01)
H01L 21/48    (2006.01)
(Continued)

(52) U.S. Cl.
CPC ............ *H01L 21/4846* (2013.01); *B32B 5/16* (2013.01); *B32B 7/02* (2013.01); *B32B 7/06* (2013.01);
(Continued)

(58) Field of Classification Search
None
See application file for complete search history.

(56) References Cited

U.S. PATENT DOCUMENTS

2005/0249927 A1* 11/2005 Suzuki .................... B32B 15/08
428/209
2008/0174016 A1*  7/2008 Sato ...................... H05K 1/0346
257/741
(Continued)

FOREIGN PATENT DOCUMENTS

JP    2001-093951 A    4/2001
JP    2005-101137 A    4/2005
(Continued)

OTHER PUBLICATIONS

International Search Report issued with respect to Patent Application PCT/JP2017/006422, dated Apr. 25, 2017.
(Continued)

*Primary Examiner* — Seth Dumbris
(74) *Attorney, Agent, or Firm* — Greenblum & Bernstein, P.L.C.

(57) ABSTRACT

There is provided a copper foil provided with a carrier providing excellent chemical resistance against the copper flash etching solution during the formation of the wiring layer on the surface of the coreless support and excellent visibility of the wiring layer due to high contrast to the antireflective layer in image inspection after copper flash etching. The copper foil provided with a carrier comprises a carrier; a release layer provided on the carrier; an antire-
(Continued)

flective layer provided on the release layer and composed of at least one metal selected from the group consisting of Cr, W, Ta, Ti, Ni and Mo; and an extremely-thin copper layer provided on the antireflective layer; wherein at least the surface adjacent to the extremely-thin copper layer of the antireflective layer comprises an aggregate of metal particles.

15 Claims, 5 Drawing Sheets

(51) Int. Cl.
| | |
|---|---|
| B32B 7/06 | (2019.01) |
| B32B 5/16 | (2006.01) |
| H05K 1/09 | (2006.01) |
| B32B 7/02 | (2019.01) |
| B32B 15/04 | (2006.01) |
| H01L 23/495 | (2006.01) |
| C23C 14/16 | (2006.01) |
| H05K 3/02 | (2006.01) |
| C25D 1/04 | (2006.01) |
| C23C 14/06 | (2006.01) |
| H05K 1/18 | (2006.01) |
| C23C 14/35 | (2006.01) |
| C25D 3/38 | (2006.01) |
| G03F 7/16 | (2006.01) |
| H01L 21/56 | (2006.01) |
| H01L 21/683 | (2006.01) |
| H01L 23/31 | (2006.01) |
| G03F 7/11 | (2006.01) |
| G03F 7/40 | (2006.01) |
| G03F 7/09 | (2006.01) |
| H01L 23/498 | (2006.01) |

(52) U.S. Cl.
CPC .......... *B32B 15/04* (2013.01); *C23C 14/0605* (2013.01); *C23C 14/165* (2013.01); *C23C 14/35* (2013.01); *C25D 1/04* (2013.01); *C25D 3/38* (2013.01); *G03F 7/164* (2013.01); *H01L 21/568* (2013.01); *H01L 21/6835* (2013.01); *H01L 23/49541* (2013.01); *H05K 1/09* (2013.01); *H05K 1/187* (2013.01); *H05K 3/025* (2013.01); *H05K 999/99* (2013.01); *G03F 7/091* (2013.01); *G03F 7/11* (2013.01); *G03F 7/40* (2013.01); *H01L 21/4828* (2013.01); *H01L 23/3107* (2013.01); *H01L 23/498* (2013.01); *H01L 2221/68359* (2013.01); *Y10T 428/12438* (2015.01)

(56) References Cited

U.S. PATENT DOCUMENTS

| | | | |
|---|---|---|---|
| 2009/0291319 | A1 | 11/2009 | Nagatani et al. |
| 2015/0044492 | A1* | 2/2015 | Yoshikawa ............. B32B 15/04 |
| | | | 428/551 |
| 2017/0135219 | A1* | 5/2017 | Hsu ...................... H01L 23/5225 |

FOREIGN PATENT DOCUMENTS

| | | | |
|---|---|---|---|
| JP | 4072431 B2 | 4/2008 | |
| JP | 2008-182222 A | 8/2008 | |
| JP | 2010-222657 A | 10/2010 | |
| JP | 4726855 B2 | 7/2011 | |
| JP | 2014046600 A | 3/2014 | |
| JP | 2015-35551 A | 2/2015 | |
| JP | 2015-157472 A | 9/2015 | |
| TW | 1304716 B | 10/2006 | |
| WO | WO-2015040998 A1 * | 3/2015 | ............. H05K 3/384 |
| WO | 2015/076372 A1 | 5/2015 | |
| WO | 2015/108191 A1 | 7/2015 | |

OTHER PUBLICATIONS

International Preliminary Report on Patentability issued with respect to Patent Application PCT/JP2017/006422, dated Sep. 4, 2018.
International Search Report issued with respect to Patent Application PCT/JP2016/076046, dated Nov. 8, 2016.
International Preliminary Report on Patentability issued with respect to Patent Application PCT/JP2016/076046, dated Sep. 4, 2018.
TW Office Action issued in TW Patent Application No. 106106510, dated Jul. 9, 2020, English translation.

* cited by examiner

COPPER FOIL WITH CARRIER, PRODUCTION METHOD FOR SAME, PRODUCTION METHOD FOR CORELESS SUPPORT WITH WIRING LAYER, AND PRODUCTION METHOD FOR PRINTED CIRCUIT BOARD

TECHNICAL FIELD

The present invention relates to a copper foil provided with a carrier and a method for manufacturing the copper foil provided with a carrier, and methods for manufacturing a coreless support provided with a wiring layer and a printed wiring board.

BACKGROUND ART

In recent years, multilayer printed wiring boards have gradually prevailed to meet a decrease in size of and an increase in mounting density on the printed wiring board. Such multilayer printed wiring boards have been used for reductions in weight and size of many portable electronic devices. Requirements for the multilayer printed wiring boards include a further reduction in thickness of the insulating interlayer and a further reduction in weight of the wiring board itself.

To meet such requirements, a method for manufacturing a multilayer printed wiring board by a coreless build-up process has been employed. The coreless build-up process alternately builds up insulating layers and wiring layers without a so-called core substrate into a multilayer. In the coreless build-up process, it has been proposed to use a copper foil provided with a carrier to facilitate separation between the support and the multilayer printed wiring board. For example, Patent Document 1 (JP2005-101137A) discloses a method for manufacturing a package substrate for mounting semiconductor devices, comprising bonding an insulating resin layer to the carrier surface of a copper foil provided with a carrier to form a support and then forming a first wiring conductor adjacent to the extremely-thin copper layer of the copper foil provided with a carrier by a process, for example, photoresist processing, pattern electrolytic copper plating, or resist removal, followed by forming a build-up wiring layer, releasing the supporting substrate provided with a carrier, and removing the extremely-thin copper layer Meanwhile, a copper foil provided with a carrier having an extremely-thin copper layer having a thickness of 1 μm or less has been desired to miniaturize the embedded circuit as shown in Patent Document 1. Accordingly, it has been proposed to form an extremely-thin copper layer by vapor deposition to achieve a reduction in thickness of the extremely-thin copper layer. For example, Patent Document 2 (JP4726855B2) discloses a copper foil with a carrier sheet interposed by a bonding interface layer. The bonding interface layer consists of two sublayers, i.e., a metal sublayer (adjacent to the carrier sheet) and a carbon sublayer (adjacent to the extremely-thin copper layer) and the copper foil layer was prepared by forming a first copper layer having a thickness of 10 nm to 300 nm on the bonding interface layer by physical vapor deposition and further forming a second copper layer by electrolysis. This document also discloses that the metal sublayer of the bonding interface layer may be composed of any one of tantalum, niobium, zirconium, nickel, chromium, titanium, iron, silicon, molybdenum, vanadium, and tungsten.

Patent Document 3 (JP4072431) discloses a copper foil provided with a carrier having a surface provided with, in sequence, a chromium release layer, an antidiffusion layer readily absorbable light having wavelengths oscillated by $CO_2$ gas laser, and an electrolytic copper plating layer, wherein the antidiffusion layer is a single-metal layer composed of an element selected from the group consisting of nickel, cobalt, iron, molybdenum, tungsten, aluminum, and phosphorus, or an alloy layer composed of two or more elements selected from the group consisting of nickel, cobalt, iron, chromium, molybdenum, tungsten, copper, aluminum and phosphorus or a metal oxide layer of one or more elements.

CITATION LIST

Patent Documents

Patent Document 1: JP2005-101137A
Patent Document 2: JP4726855B2
Patent Document 3: JP4072431 B2
Patent Document 4: JP2015-35551

SUMMARY OF INVENTION

Meanwhile, the use of a coreless build-up process is also examined in Fan-Out Wafer Level Packaging (FO-WLP) and Fan-Out Panel Level Packaging (FO-PLP), which are packaging technologies for printed wiring boards. A Redistribution Layer-First (RDL-First) method is one of the packaging technologies (see, for example, Patent Document 4 (JP2015-35551A) that involves forming a wiring layer and a build-up wiring layer, as required, on the surface of a coreless support, releasing the support as required, and then mounting the chip. This method enables image inspection of the wiring layer on the surface of the coreless support and each built-up wiring layer stacked thereafter before chip mounting, so that the chip may be mounted only on non-defective portion of each wiring layer. As a result, the RDL-First method, which does not cause wasteful use of the chip, is economically advantageous compared to the Chip-First method, which sequentially stacks the wiring layer on the surface of the chip. Image inspection immediately after the wiring layer is formed on the surface of the coreless support involves processes such as photoresist processing, electroplating, and photoresist peeling on the surface of the coreless support, flash etching of the extremely-thin copper layer existing between the wirings as necessary, followed by mounting of electronic elements such as chips as necessary, resulting in build-up layer. If the extremely-thin copper layer, however, is removed by copper flash etching in this way, sufficient visual contrast with the carrier exposed as a substrate may not be ensured, causing decreased visibility in an image inspection (e.g., automatic optical inspection (AOI)) of a copper wiring layer. Accordingly, an antireflective layer for improving the visual contrast is provided between the release layer of the copper foil provided with a carrier and the extremely-thin copper layer, and this antireflective layer is left after being subjected to copper flash etching. It is advantageous if such a process could improve the visibility of the wiring layer at the time of image inspection. It is also desirable that such an antireflective layer be not etched away in a copper flash etching solution, that is, it has high chemical resistance against a copper flash etching solution.

The inventors have now found that an antireflective layer interposed between the release layer of the copper foil provided with a carrier and the extremely-thin copper layer, the antireflective layer being composed of a predetermined metal and having an aggregate of metal particles at least on the surface adjacent to the extremely-thin copper layer, can provide excellent chemical resistance against the copper flash etching solution during the formation of the wiring layer on the surface of the coreless support and high visibility of the wiring layer due to high contrast to the antireflective layer in the image inspection after the copper flash etching.

Accordingly, an object of the present invention is to provide a copper foil provided with a carrier that provides excellent chemical resistance of the antireflective layer against the copper flash etching solution during the formation of the wiring layer on the surface of the coreless support and high visibility of a wiring layer due to high contrast to an antireflective layer in the image inspection after the copper flash etching.

According to an aspect of the present invention, there is provided a copper foil provided with a carrier, comprising:
 a carrier;
 a release layer provided on the carrier;
 an antireflective layer provided on the release layer and composed of at least one metal selected from the group consisting of Cr, W, Ta, Ti, Ni and Mo; and
 an extremely-thin copper layer provided on the antireflective layer;
 wherein at least the surface adjacent to the extremely-thin copper layer of the antireflective layer comprises an aggregate of metal particles.

According to another aspect of the present invention, there is provided a method for manufacturing the copper foil provided with a carrier according to the above aspect, including:
 forming the release layer on the carrier;
 forming the antireflective layer on the release layer by magnetron sputtering with a metal target composed of at least one metal selected from the group consisting of Cr, W, Ta, Ti, Ni and Mo in an inert gas atmosphere under a pressure of 1 to 20 Pa; and
 forming the extremely-thin copper layer on the antireflective layer.

According to another aspect of the present invention, there is provided a method for manufacturing a coreless support provided with a wiring layer, including the steps of:
 providing the copper foil provided with a carrier according to the above aspects as a support;
 forming a photoresist layer with a predetermined pattern on the surface of the extremely-thin copper layer;
 forming an electrolytic copper plating layer on the exposed surface of the extremely-thin copper layer;
 peeling off the photoresist layer; and
 removing an unnecessary portion of the extremely-thin copper layer by copper flash etching to expose the antireflective layer, thereby preparing a coreless support provided with a wiring layer.

According to another aspect of the present invention, there is provided a method for manufacturing a printed wiring board, including the steps of:
 manufacturing the coreless support provided with a wiring layer by the method according to one of the above aspects; and
 mounting an electronic element on the coreless support provided with the wiring layer after the image inspection.

According to another aspect of the present invention, there is provided a method for manufacturing a printed wiring board, including the steps of:
 manufacturing the coreless support provided with a wiring layer by the method according to one of the above aspects, or manufacturing the printed wiring board by the method according to the above aspect;
 forming a build-up layer on a surface having the wiring layer of the coreless support provided with a wiring layer to prepare a laminate with a build-up layer;
 separating the laminate with a build-up layer at the release layer to prepare a multilayer wiring board including the build-up layer; and
 removing the antireflective layer by flash etching to prepare a printed wiring board.

DESCRIPTION OF EMBODIMENT

Copper Foil Provided with a Carrier

Figure 1:
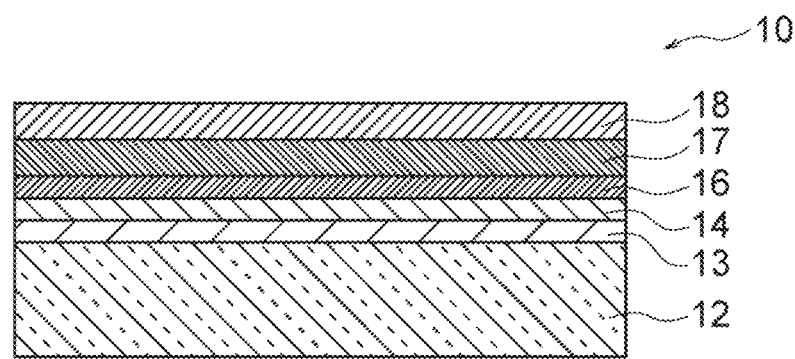
FIG. 1 is a schematic cross-sectional diagram illustrating an embodiment of a copper foil provided with a carrier of the present invention.

The copper foil provided with a carrier of the present invention is schematically illustrated in FIG. 1. As shown in FIG. 1, the copper foil 10 provided with a carrier of the present invention includes a carrier 12, a release layer 16, an antireflective layer 17, and an extremely-thin copper layer 18 in this order. The release layer 16 is provided on the carrier 12 for release of the carrier. The antireflective layer 17 is provided on the release layer 16 to prevent reflection of light. The antireflective layer 17 is made of at least one metal selected from the group consisting of Cr, W, Ta, Ti, Ni and Mo, and at least the surface adjacent to the extremely-thin copper layer 18 is composed of an aggregate of metal particles. The extremely-thin copper layer 18 is composed of copper provided on the antireflective layer 17. The copper foil 10 provided with a carrier of the present invention may be provided with an optional adhesive metal layer 13 and/or an optional release assisting layer 14 adjacent to the release layer 16 on the surface of the carrier 12, preferably the adhesive metal layer 13 and release assisting layer 14 in this order. Furthermore, these layers may be stacked on the upper and lower surfaces of the carrier 12 to be symmetric about the carrier 12. The copper foil 10 provided with a carrier may have any known layer structure with proviso that the copper foil 10 provided with carrier is provided with the antireflective layer 17 and the optional adhesive metal layer 13 and/or release assisting layer 14.

Thus, a copper foil provided with a carrier in which an antireflective layer 17 composed of a predetermined metal, having an aggregate of metal particles at least on the surface adjacent to the extremely-thin copper layer 18, is interposed between the release layer 16 and the extremely-thin copper layer 18 has the following advantages: (1) excellent chemical resistance of the reflective layer against the copper flash etching solution during the formation of the wiring layer on the surface of the coreless support and (2) excellent visibility of the wiring layer due to high contrast to the antireflective layer in image inspection (e.g., automatic optical inspection (AOI)) after copper flash etching. Regarding advantage (1), at least one metal selected from Cr, W, Ta, Ti, Ni, and Mo constituting the antireflective layer 17 cannot be etched away in the copper flash etching solution, and thus exhibits high chemical resistance against the copper flash etching solution. Regarding advantage (2), the aggregate of metal particles constituting at least the surface adjacent to the extremely-thin copper layer 18 of the antireflective layer 17 exhibits a desirable dark color due to the metallic material and granular form, and its dark color provides a desirable visual contrast to the wiring layer composed of copper, resulting in the improved visibility in image inspection (e.g., automatic optical inspection (AOI)). In addition, the manufacture of a coreless support provided with a wiring layer or a printed wiring board using the copper foil provided with a carrier of the present invention has further advantage (3): The erosion of the wiring layer exposed under the antireflective layer can be significantly reduced when the antireflective layer is removed by flash etching. In other words, a highly selective etching solution may be used in flash etching at least one metal selected from Cr, W, Ta, Ti, Ni and Mo constituting the antireflective layer 17 to reduce or prevent elution of the copper constituting the wiring layer in the etching solution.

The material of the carrier 12 may be any one of glass, ceramic, resin, and metal. Furthermore, the form of the carrier 12 may be any one of sheet, film, plate, and foil. Furthermore, the carrier 12 may be a laminate of materials such as sheets, films, plates, and foils. For example, the carrier 12 may function as a rigid support such as a glass plate, a ceramic plate, and a metal plate, or may be in a nonrigid support such as a metal foil or a resin film. Examples of the preferred metal of the carrier 12 include copper, titanium, nickel, stainless steel, and aluminum. Examples of the preferred ceramics include alumina, zirconia, silicon nitride, and aluminum nitride (fine ceramics). Examples of the preferred resin include PET resins, PEN resins, aramid resins, polyimide resins, nylon resins, liquid crystal polymers, PEEK resins, polyimide resins, polyamide-imide resins, polyethersulfone resins, polyphenylene sulfide resins, PTFE resins, and ETFE resin. In view of preventing warping of the coreless support by heating during mount of the electronic elements, these materials preferably have a coefficient of thermal expansion (CTE) of less than 25 ppm/K (typically 1.0 to 23 ppm/K). Examples of such materials include the above-mentioned resins (especially low-thermal-expansion resins such as polyimide resins and liquid crystal polymers), glass, and ceramics. In view of handling and flatness during chip mounting, the Vickers hardness of the carrier 12 is preferably 100 HV or more, more preferably 150 to 2500 HV. In terms of material satisfying these properties, the carrier 12 is preferably composed of resin, glass or ceramics, more preferably composed of glass or ceramics, most preferably composed of glass. For example, the carrier 12 is a glass sheet. The carrier 12 composed of glass has advantages such as lightweight, low thermal expansion coefficient, high insulating property, rigidity and a flat surface, so that the surface of the extremely-thin copper layer 18 can be made extremely smooth. Furthermore, the carrier composed of glass has advantages such as surface flatness (coplanarity) suitable for mounting an electronic device, resistance against chemicals in the desmear process of manufacturing a printed wiring board and various plating processes, and separation of the laminate with the build-up layer described later by a chemical separation process. Examples of the preferred glass constituting the carrier 12 include quartz glass, borosilicate glass, non-alkali glass, soda-lime glass, aminosilicate glass, and combinations thereof, particularly preferably non-alkali glass. The non-alkali glass is substantially free of alkali metal and mainly contains alkaline earth metal oxide, e.g., silicon dioxide, aluminum oxide, boron oxide, and an alkaline earth metal oxide, such as calcium oxide and barium oxide, and boric acid. The non-alkali glass has a low stable thermal expansion coefficient of 3 to 5 ppm/K in a wide temperature range from 0° C. to 350° C., so that warpage of the glass is advantageously minimized during mount of a semiconductor chip as an electronic element. The carrier has a thickness of preferably 100 to 2000 µm, more preferably 300 to 1800 µm, most preferably 400 to 1100 µm. The carrier having a thickness within such a range can achieve thinning of the printed wiring board and a reduction in warpage during mounting of the electronic parts, while maintaining adequate strength that does not interfere with handling.

The surface adjacent to the release layer 16 (adjacent to the adhesive metal layer 13, if present) of the carrier 12 has an arithmetic average roughness Ra of 0.1 to 70 nm, more preferably from 0.5 to 60 nm, still more preferably from 1.0 to 50 nm, particularly preferably from 1.5 to 40 nm, most preferably from 2.0 to 30 nm, measured in accordance with JIS B 0601-2001. Thus, such a carrier having a smaller arithmetic average roughness can lead to a smaller arithmetic average roughness Ra on the surface of the extremely-thin copper layer 18 remote from the release layer 16 (the outer surface of the extremely-thin copper layer 18), resulting in a copper foil 10 provided with a carrier suitable for forming an ultrastructural wiring pattern having such a fine line/space (L/S) of (13 µm or less)/(13 µm or less) (e.g., 12 µm/12 µm to 2 µm/2 µm) in the printed wiring board.

The optional adhesive metal layer 13 is preferably composed of at least one metal selected from the group consisting of Ti, Cr and Ni from the viewpoint of securing adhesion to the carrier, and may be composed of a pure metal or an alloy. The metal constituting the adhesive metal layer 13 may contain incidental impurities derived from, for example, raw material components and the deposition process. In addition, the presence of oxygen, which is incorporated in the adhesive metal layer 13 during its exposure to the atmosphere after the deposition of the adhesive metal layer 13, is allowable without any particular limitation. The adhesive metal layer 13 is preferably formed by vapor phase deposition such as sputtering. The adhesive metal layer 13 is particularly preferably formed by magnetron sputtering with a metal target in terms of improved uniformity of the film thickness distribution. The adhesive metal layer 13 has a thickness of preferably 5 to 500 nm, more preferably 10 to 300 nm, most preferably 18 to 200 nm, particularly preferably 20 to 100 nm. This thickness is determined from the cross section of the layer with transmission electron microscopy-energy dispersive X-ray spectroscopy (TEM-EDX).

The optional release assisting layer 14 is preferably composed of copper because the release strength with the release layer 16 is controlled to a desired value and an excellent wiring pattern is formed by preventing the detachment of the intermediate layer caused when the coreless support or carrier is released. The copper constituting the release assisting layer 14 may contain incidental impurities from, for example, raw material components and a deposition process. The presence of oxygen, which is incorporated in the release assisting layer 14 during its exposure to the atmosphere before and after the deposition of the release assisting layer, is allowable. It is preferred, but should not be limited, that the adhesive metal layer 13 and the release assisting layer 14 be continuously formed without being exposed to the air. The release assisting layer 14 is preferably formed by vapor phase deposition such as sputtering. The release assisting layer 14 is preferably formed by magnetron sputtering with a copper target in view of the improved uniformity of film thickness distribution. The release assisting layer 14 has a thickness of preferably 5 to 500 nm, more preferably 10 to 400 nm, most preferably 15 to 300 nm, particularly preferably 20 to 200 nm. This thickness is determined from the cross section of the layer with transmission electron microscopy-energy dispersive X-ray spectroscopy (TEM-EDX).

It should be noted that another intervening layer may be present between the adhesive metal layer 13 and the release assisting layer 14. Examples of constituent materials of the intervening layer include alloys of Cu with at least one metal selected from the group consisting of Ti, Cr, Mo, Mn, W and Ni.

Alternatively, the adhesive metal layer 13 and the release assisting layer 14 may be replaced with a single intermediate alloy layer. The intermediate alloy layer is preferably composed of a copper alloy having a content of at least one metal M selected from the group consisting of Ti, Cr, Mo, Mn, W and Ni of 1.0 atom % or more and a copper content of 30 atom % or more. In detail, it is preferred that the metal constituting the intermediate alloy layer be a copper alloy of a metal M and Cu in view of compatibility between the secured adhesion of the carrier 12 to the intermediate alloy layer and the ease of release to the release layer 16. Among them, an alloy of Cu and at least one metal selected from the group consisting of Ti, Mo, and Mn is more preferred. The content of the metal M in the intermediate alloy layer is preferably 1.0 atom % or more, more preferably 3.0 atom % or more, still more preferably 5.0 atom % or more. The metal M content in the intermediate alloy layer has no upper limit, but has preferably 30 atom % or less, more preferably 20 atom % or less. The intermediate alloy layer has a Cu content of preferably 30 atom % or more, more preferably 40 atom % or more, still more preferably 50 atom % or more. The intermediate alloy layer has no upper limit of the Cu content, but has a Cu content of preferably 99.5 atom % or less, more preferably 97.0 atom % or less, most preferably 96.0 atom % or less. The intermediate alloy layer is preferably formed by vapor phase deposition process such as sputtering. It is particularly preferred that the intermediate alloy layer be formed by magnetron sputtering with a copper alloy target from the viewpoint of the improved uniformity of the film thickness distribution. The intermediate alloy layer has a thickness of preferably 5 to 500 nm, more preferably 10 to 400 nm, most preferably 15 to 300 nm, particularly preferably 20 to 200 nm. This thickness is determined from the cross section of the layer with transmission electron microscopy-energy dispersive X-ray spectroscopy (TEM-EDX). Another intervening layer may be present in the intermediate alloy layer. Examples of constituent materials of the intervening layer include alloys of Cu with at least one metal selected from the group consisting of Ti, Cr, Mo, Mn, W and Ni.

The release layer 16, which facilitates detachment of the carrier 12, may be composed of a known material used in a release layer of a copper foil provided with a carrier. The release layer 16 may be either an organic release layer or an inorganic release layer. Examples of the organic component used in the organic release layer include nitrogen-containing organic compounds, sulfur-containing organic compounds, and carboxylic acids. Examples of the nitrogen-containing organic compounds include triazole compounds and imidazole compounds. Examples of the inorganic component used in the inorganic release layer include at least one metal oxide of Ni, Mo, Co, Cr, Fe, Ti, W, P and Zn, and examples of the layer include a carbon layer. Among these, the particularly preferred release layer 16 is a layer mainly containing carbon, from the viewpoint of releasability and film forming property, more preferably a layer mainly composed of carbon or hydrocarbon, more preferably a layer composed of amorphous carbon, which is a hard carbon film. In this case, the release layer 16 (i.e., carbon layer) has a carbon content of preferably 60 atom % or more, more preferably 70 atom % or more, most preferably 80 atom % or more, particularly preferably 85 atom % or more, measured by XPS. The release layer has no upper limit of carbon content, and the upper limit may be 100 atom %, but realistically 98 atom % or less. The release layer 16 (especially carbon layer) may contain incidental impurities (e.g., oxygen, carbon, and hydrogen derived from the surrounding environment such as atmosphere). Furthermore, metal atoms may be incorporated into the release layer 16 (especially carbon layer) during the deposition process of the antireflective layer 17. Low inter-diffusion and reactivity with carriers of carbon can prevent formation of metal bond between the copper foil layer and the bonding interface caused by high temperature during press processing at a temperature exceeding 300° C., resulting in maintaining ready removal of carriers. This release layer 16 is also preferably formed by vapor phase deposition process such as sputtering in view of a reduction in excess impurities in the amorphous carbon and the continuous productivity with the deposition of the adhesive metal layer 13 and/or release assisting layer 14. The release layer 16 has a thickness of preferably 1 to 20 nm, more preferably 1 to 10 nm. This thickness is a value determined by analyzing the cross section of the layer with transmission electron microscopy-energy dispersive X-ray spectroscopy (TEM-EDX).

The antireflective layer 17 is composed of at least one metal selected from the group consisting of Cr, W, Ta, Ti, Ni and Mo, and at least the surface adjacent to the extremely-thin copper layer 18 is composed of an aggregate of metal particles. In this case, the antireflective layer 17 may have a layer structure composed entirely of an aggregate of metal particles, or a layer structure of a several layers including a layer composed of aggregates of metal particles and a layer which is non-particulate at the bottom thereof. As described above, the aggregate of metal particles of the surface adjacent to the extremely-thin copper layer 18 of the antireflective layer 17 exhibits a desirable dark color due to the metal material and granular form, and its dark color provides a desirable visual contrast to the wiring layer composed of copper, resulting in the improved visibility in image inspection (e.g., automatic optical inspection (AOI)). That is, the surface of the antireflective layer 17 diffusely reflects light due to the convex shape of the metal particles to be visually recognized as black. Furthermore, the antireflective layer 17 has an adequate adhesion and releasability with respect to the release layer 16, excellent adhesion to the extremely-thin copper layer 18, and high peeling resistance against the developer at the time of forming the photoresist layer. The glossiness Gs (60°) of the surface adjacent to the extremely-thin copper layer 18 of the antireflective layer 17 is preferably 500 or less in view of such improved contrast and visibility, more preferably 450 or less, still more preferably 400 or less, particularly preferably 350 or less, and most preferably 300 or less. The lower limit of the glossiness Gs (60°) is preferably as low as possible, but the surface adjacent to the extremely-thin copper layer 18 of the antireflective layer 17 has a glossiness Gs (60°) of effectively 100 or more, and more effectively 150 or more. The specular glossiness Gs (60°) is determined by image analysis of roughened particles in accordance with JIS Z 8741-1997 (specular glossiness—measurement method) with a commercially available gloss meter.

In view of improved contrast and visibility and improved uniformity of flash etching, the surface adjacent to the extremely-thin copper layer 18 of the antireflective layer 17 is preferably composed of an aggregate of metal particles having a projected area circle equivalent diameter of preferably 10 to 100 nm, more preferably 25 to 100 nm, and most preferably 65 to 95 nm, determined by SEM image analysis. Such a projected area circle equivalent diameter can be determined by photographing the surface of the antireflective layer 17 with a scanning electron microscope at a predetermined magnification (e.g., 50,000 times) and analyzing the observed SEM image. Specifically, the arithmetic mean value of projected area circle equivalent diameters measured using commercially available image analysis particle size distribution software (e.g., manufactured by Mountech Co., Ltd., Mac-VIEW) is employed.

The antireflective layer 17 is composed of at least one metal selected from Cr, W, Ta, Ti, Ni and Mo, preferably at least one metal selected from Ta, Ti, Ni and Mo, more preferably at least one metal selected from Ti, Ni and Mo, most preferably Ti. These metals may be either pure metals or alloys. In any event, essentially unoxidized metals (essentially not metal oxides) are preferred because they exhibit a desired dark color which improves the visual contrast to Cu. Specifically, the antireflective layer 17 has an oxygen content of preferably 0 to 15 atom %, more preferably 0 to 13 atom %, most preferably 1 to 10 atom %. In any case, the metal cannot be etched away in the copper flash etching solution, and thus exhibits high chemical resistance against the copper flash etching solution. The antireflective layer 17 has a thickness of preferably 1 to 500 nm, more preferably 10 to 300 nm, most preferably 20 to 200 nm, particularly preferably 30 to 150 nm.

The extremely-thin copper layer 18 may be manufactured by any process. Examples of the process include wet processes, such as electroless copper plating and electrolytic copper plating; physical vapor deposition, such as sputtering and vacuum vapor deposition; chemical vapor deposition; and combination thereof. A particularly preferred extremely-thin copper layer is manufactured by vapor phase deposition, for example, sputtering or vacuum vapor deposition because the resulting copper foil is extremely-thin and is suitable to meet a fine pitch, and the most preferred is manufactured by sputtering. Although the extremely-thin copper layer is preferably not roughened, the layer may be preliminarily or secondarily roughened by soft etching, rinsing, or oxidation-reduction with proviso that the wiring pattern can be readily formed during the production of printed wiring boards. Although the extremely-thin copper layer 18 may have any thickness, the layer has a thickness of preferably 50 to 3000 nm, more preferably 70 to 2500 nm, still more preferably 80 to 2000 nm, particularly preferably 90 to 1500 nm, most preferably 120 to 1000 nm or 150 to 500 nm to satisfy the fine pitch as described above. The extremely-thin copper layer having such a thickness within this range is preferably manufactured by sputtering from the viewpoint of uniformity of in-plane thickness of layer and productivity in sheet form or roll form.

The extremely-thin copper layer 18 has a surface remote from the release layer 16 (the outer surface of the extremely-thin copper layer 18), and the surface has an arithmetic average roughness Ra of preferably 1.0 to 100 nm, more preferably from 2.0 to 40 nm, still more preferably from 3.0 to 35 nm, particularly preferably from 4.0 to 30 nm, most preferably from 5.0 to 15 nm, measured in accordance with JIS B 0601-2001. Such a copper foil 10 provided with a carrier having a smaller arithmetic average roughness is suitable for forming an ultrastructural wiring pattern having such a fine line/space (L/S) of (13 μm or less)/(13 μm or less) (e.g., 12 μm/12 μm to 2 μm/2 μm) in the printed wiring board.

It is preferred that the antireflective layer 17, the extremely-thin copper layer 18, the optional adhesive metal layer 13, the optional release assisting layer 14, and the optional release layer 16 (i.e., at least the antireflective layer 17 and the extremely-thin copper layer 18) extend to the end faces of the carrier 12 to cover the end faces of the carrier 12. More specifically, it is preferred that not only the surface but also the end faces of the carrier 12 be covered with at least the antireflective layer 17 and the extremely-thin copper layer 18. Covering the end faces in addition to the surface can prevent intrusion of the chemical solution from the carrier 12 in the printed wiring board process, and also can effectively prevent chipping due to peeling at the side ends, i.e., chipping of the coating on the release layer 16 (i.e., the extremely-thin copper layer 18 and the antireflective layer 17) when the coreless support is handled (for example, when the coreless support is carried by rollers). The adhesive metal layer 13 has a thickness (in the direction perpendicular to the end face, hereinafter referred to as "end-face thickness") on the end face of the carrier 12 of preferably 2 to 350 nm, more preferably 3 to 220 nm, most preferably 5 to 150 nm, particularly preferably 6 to 70 nm. The release assisting layer 14 has an end-face thickness of preferably 2 to 350 nm, more preferably 3 to 220 nm, most preferably 5 to 150 nm, particularly preferably 6 to 70 nm. The release layer 16 has an end-face thickness of preferably 0 to 15 nm, more preferably 0 to 3 nm, most preferably 0 to 1 nm, particularly preferably 0 to 0.5 nm, most preferably 0 nm. In other words, it is most preferred that the release layer 16 be not formed on the end faces of the carrier. The antireflective layer 17 has an end-face thickness of preferably 2 to 350 nm, more preferably 3 to 220 nm, most preferably 5 to 150 nm, particularly preferably 6 to 70 nm. The extremely-thin copper layer 18 has an end-face thickness of preferably 15 to 2800 nm, more preferably 20 to 1800 nm, most preferably 25 to 1400 nm, particularly preferably 27 to 1350 nm, particularly preferably 35 to 700 nm, most preferably 45 to 350 nm. Furthermore, the coating region on the end faces of the carrier 12 covers a region of preferably 0.1 mm or more in the thickness direction (perpendicular to the carrier surface) from the surface of the carrier 12, more preferably a region of 0.2 mm or more, more preferably the entire end face of the carrier 12. In this way, chipping of the film at the side ends of the coreless support and the penetration of the chemical liquid into the carrier in the printed wiring board process can be effectively prevented.

Production of Copper Foil Provided with Carrier

The copper foil 10 provided with a carrier according to the present invention can be manufactured by providing the carrier 12 and forming a release layer 16, an antireflective layer 17, and an extremely-thin copper layer 18 on the carrier 12. An optional adhesive metal layer 13 and/or an optional release assisting layer 14 may be formed on the carrier 12, preferably the adhesive metal layer 13 and the release assisting layer 14 are formed in this order, prior to the formation of the release layer 16. In any case, the adhesive metal layer 13 (if present), the release assisting layer 14 (if present), the release layer 16, the antireflective layer 17, and the extremely-thin copper layer 18 are preferably formed by vapor phase deposition because they are suitable for fine pitch requirements due to extremely-thin standards. Examples of the vapor phase deposition include sputtering, vacuum vapor deposition, and ion plating, most preferably sputtering from the viewpoint of controlling the film thickness over a wide range of 0.05 nm to 5,000 nm and maintaining the uniform film thickness over a wide width or wide area. In particular, sputtering remarkably enhances the efficiency of manufacturing by forming all of the adhesive metal layer 13 (if present), the release assisting layer 14 (if present), the release layer 16, the antireflective layer 17 and the extremely-thin copper layer 18. The vapor phase deposition process can be carried out under known conditions with any known vapor deposition system. For example, if sputtering is used, then any of various known sputtering techniques such as magnetron sputtering, bipolar sputtering and counter target sputtering can be used. Magnetron sputtering is preferred in view of high deposition rate and high productivity. Sputtering can be performed with a direct current (DC) supply or radio frequency (RF) supply. Regarding the target shape, a well-known plate target can be used, but it is desirable to use a cylindrical target from the viewpoint of the efficiency of use of the target. Vapor phase deposition of each of the adhesive metal layer 13 (if present), the release assisting layer 14 (if present), the release layer 16, the antireflective layer 17 and the extremely-thin copper layer 18 (preferably a sputtering) will be described.

It is preferred that vapor phase deposition of an optional adhesive metal layer 13 be carried out by magnetron sputtering in a non-oxidizing atmosphere with a target composed of at least one metal selected from the group consisting of Ti, Cr and Ni in view of improved uniformity in film thickness distribution. The silicon target preferably has a purity of 99.9% or more. The gas used for sputtering includes inert gas such as argon gas. Argon can be supplied at any flow rate, which may be determined as appropriate according to dimensions of the sputtering chamber and deposition conditions. The pressure during film deposition is preferably set in a range of 0.1 to 20 Pa from the view point of continuous formation of a stable film without operation failures such as abnormal discharge and plasma irradiation failure. This pressure range can be set by adjusting the electric power for film deposition and the flow rate of argon depending on the structure and volume of the device, the exhaust capacity of the vacuum pump, and the rated capacity of power supply for the film deposition. The sputtering power (per unit area of the target) can be appropriately determined within the range of 0.05 to 10.0 W/cm$^2$ from the view point of, for example, the uniform thickness and productivity of the film.

It is preferred that the vapor phase deposition of the optional release assisting layer 14 be carried out by magnetron sputtering with a copper target under a non-oxidizing atmosphere in terms of the uniformity in film thickness distribution. The copper target preferably has a purity of 99.9% or more. The gas used for sputtering is preferably inert gas such as argon gas. Argon can be supplied at any flow rate, which may be determined as appropriate according to dimensions of the sputtering chamber and deposition conditions. The pressure during film deposition is preferably set in a range of 0.1 to 20 Pa from the view point of continuous formation of a stable film without operation failures such as abnormal discharge and plasma irradiation failure. This pressure range can be set by adjusting the electric power for film deposition and the flow rate of argon depending on the structure and volume of the device, the exhaust capacity of the vacuum pump, and the rated capacity of power supply for the film deposition. The sputtering power (per unit area of the target) can be appropriately determined within the range of 0.05 to 10.0 W/cm$^2$ from the view point of, for example, the uniform thickness and productivity of the film.

It is preferred that the release layer 16 of the carbon layer be deposited by a vapor phase deposition (preferably sputtering) with a carbon target under an inert atmosphere such as argon. The carbon target is preferably composed of graphite, but may contain incidental impurities (e.g., oxygen or carbon from the surrounding environment such as atmosphere). The carbon target preferably has a purity of 99.99% or more, more preferably 99.999% or more. Furthermore, the pressure during film deposition is preferably set in a range of 0.1 to 2.0 Pa from the view point of continuous formation of a stable film without operation failures such as abnormal discharge and plasma irradiation failure. This pressure range can be set by adjusting the electric power for film deposition and the flow rate of argon depending on the structure and volume of the device, the exhaust capacity of the vacuum pump, and the rated capacity of power supply for the film deposition. The sputtering power (per unit area of the target) can be appropriately determined within the range of 0.05 to 10.0 W/cm$^2$ from the view point of, for example, the uniform thickness and productivity of the film.

The antireflective layer 17 is preferably formed by magnetron sputtering with a metal target composed of at least one metal selected from the group consisting of Cr, W, Ta, Ti, Ni and Mo. The silicon target has preferably a purity of 99.9% or more. In particular, the antireflective layer 17 is formed by a magnetron sputtering in an inert gas atmosphere such as argon at a pressure of 1 to 20 Pa. The sputtering pressure is more preferably 2 to 18 Pa, still more preferably 3 to 15 Pa. Such a sputtering pressure is remarkably higher than conventional sputtering pressures, so that an aggregate of metal particles can be formed in a desired form uniformly in the in-plane surface without essentially oxidizing the surface of the antireflective layer 17. The above sputtering conditions can provide a desired projected area circle equivalent diameter and a desired glossiness Gs (60°) and can also advantageously provide continuous formation of a stable film without operation failures such as abnormal discharge and plasma irradiation failure. The pressure range may be controlled by adjusting the electric power for film deposition and the flow rate of the argon gas depending on the structure and volume of the device, the exhaust capacity of the vacuum pump, and the rated capacity of power supply for the film deposition. Argon can be supplied at any flow rate, which may be determined as appropriate according to dimensions of the sputtering chamber and deposition conditions. The sputtering power (per unit area of the target) can be appropriately determined within the range of 1.0 to 15.0 W/cm$^2$ from the view point of, for example, the uniform thickness and productivity of the film. Furthermore, it is preferred that the carrier temperature be kept constant during film formation in view of ease of achieving stable film characteristics (for example, film resistance and crystal size). The carrier temperature during film formation is preferably adjusted within the range of 25 to 300° C., more preferably 40 to 200° C., and furthermore preferably 50 to 150° C.

The extremely-thin copper layer 18 is preferably formed by vapor phase deposition (preferably sputtering process) under an inert atmosphere such as argon with a copper target. The copper target is preferably composed of metallic copper, but may contain incidental impurities. The carbon target preferably has a purity of 99.9% or more, more preferably 99.99% or more, still more preferably 99.999% or more. A cooling mechanism for the stage may be provided at the time of sputtering to avoid a temperature rise during the vapor phase deposition of the extremely-thin copper layer 18. The pressure during film deposition is preferably set in a range of 0.1 to 2.0 Pa from the view point of continuous formation of a stable film without operation failures such as abnormal discharge and plasma irradiation failure. This pressure range can be set by adjusting the electric power for film deposition and the flow rate of argon depending on the structure and volume of the device, the exhaust capacity of the vacuum pump, and the rated capacity of power supply for the film deposition. The sputtering power (per unit area of the target) can be appropriately determined within the range of 0.05 to 10.0 W/cm$^2$ from the view point of, for example, the uniform thickness and productivity of the film.

The adhesive metal layer 13, the release assisting layer 14, the release layer 16, the antireflective layer 17 and/or the extremely-thin copper layer 18 on the end faces of the carrier 12 can be readily formed by deposition while the end face of the carrier 12 is being exposed on the stage in the sputtering. In this case, the end face of the carrier 12 is typically formed into a thickness (end-face thickness) of 20% to 70% of the thickness of the layer deposited on the surface of the carrier 12. In the meantime, in the case of forming an extremely-thin film on the end face, such as forming the release layer 16, it is preferred to sputter with the side ends of the carrier 12 shielded. Examples of this type of shielding include shielding by a masking tape and shielding by a masking plate.

Laminate for Coreless Support

The copper foil provided with a carrier of the present invention may be provided in the form of a laminate for a coreless support. In other words, a preferred embodiment of the present invention provides a laminate for a coreless support comprising the copper foil provided with a carrier. The laminate for a coreless support has the following two forms: (i) The first form of the laminate for a coreless support is in the form of the copper foil 10 provided with a carrier itself. In detail, the optional adhesive metal layer 13, the optional release assisting layer 14, the release layer 16, the antireflective layer 17, and the extremely-thin copper layer 18 are formed in this order on at least one surface of the carrier 12; or the optional adhesive metal layer 13, the optional release assisting layer 14, the release layer 16, the antireflective layer 17, and the extremely-thin copper layer 18 are formed in this order on each surface of the carrier. In any case, this form can be achieved if the carrier 12 itself is rigid such as a glass plate or a metal plate and can function as a support. For example, a glass carrier 12, which is lightweight, has a low thermal expansion coefficient, is rigid and has a flat surface, has an advantage in that the surface of the extremely-thin copper layer 18 can be extremely smooth. (ii) The second form of the laminate for a coreless support may be provided in a form having an adhesive layer on the outer surface of the carrier 12 (the outer surface of the carrier 12 being remote from the release layer 16). This form is available in the case where the carrier 12 is composed of a nonrigid material such as a metal foil or a resin film. In this case, examples of the adhesive layer include a resin layer and a fiber reinforced prepreg (such as glass). For example, a possible layer structure consists of an extremely-thin copper layer 18, an antireflective layer 17, a release layer 16, an optional assisting layer 14, an optional adhesive metal layer 13, a carrier 12, an adhesive layer (not shown), a carrier 12, an optional adhesive metal layer 13, an optional release assisting layer 14, a release layer 16, an antireflective layer 17, and an extremely-thin copper layer 18.

Production of Coreless Support Provided with Wiring Layer

Figure 2:
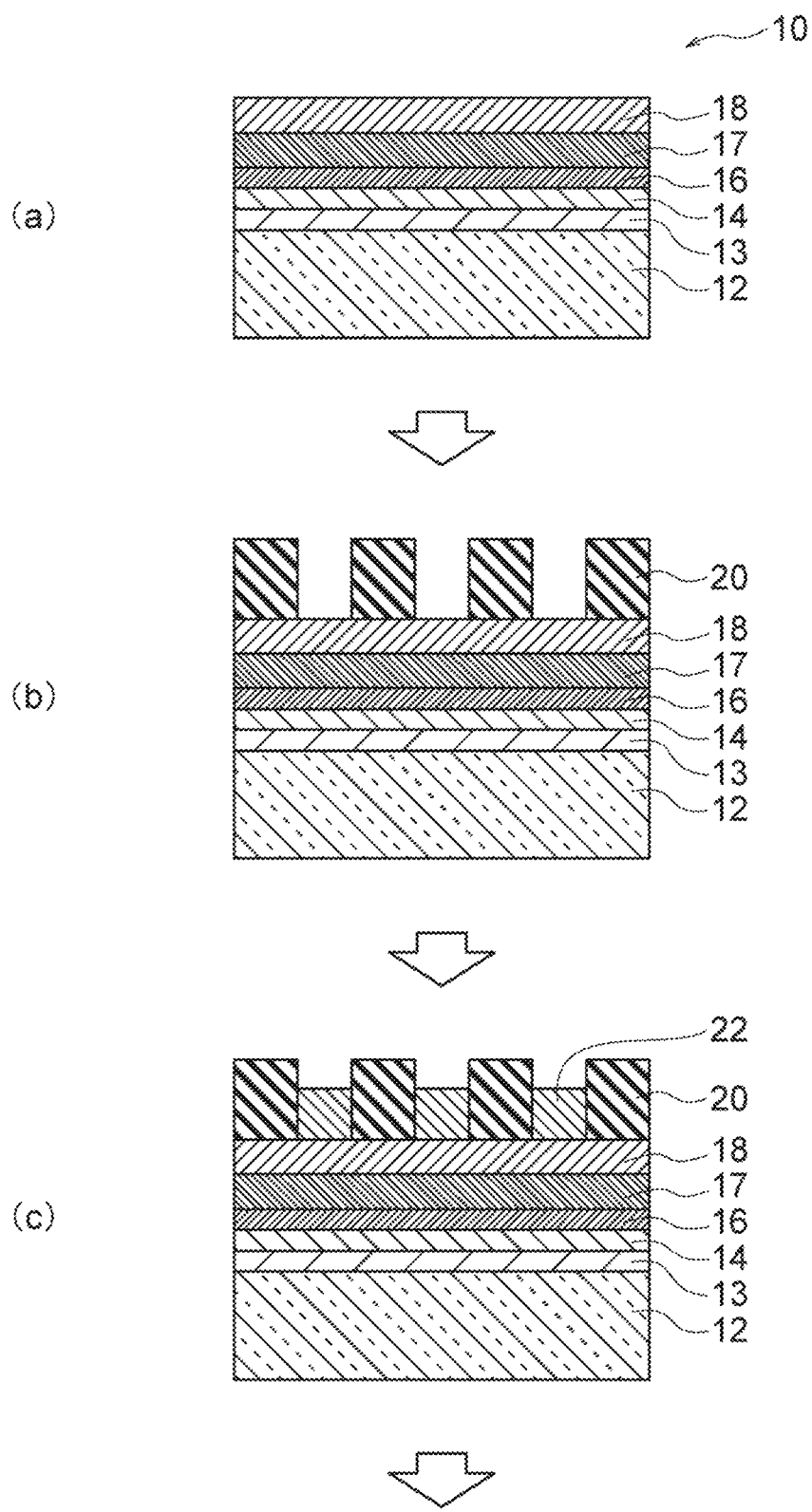
FIG. 2 is a process flow chart for explaining initial steps (steps (a) to (c)) of a method for manufacturing a coreless support provided with a wiring layer or a printed wiring board of the present invention.
Figure 3:
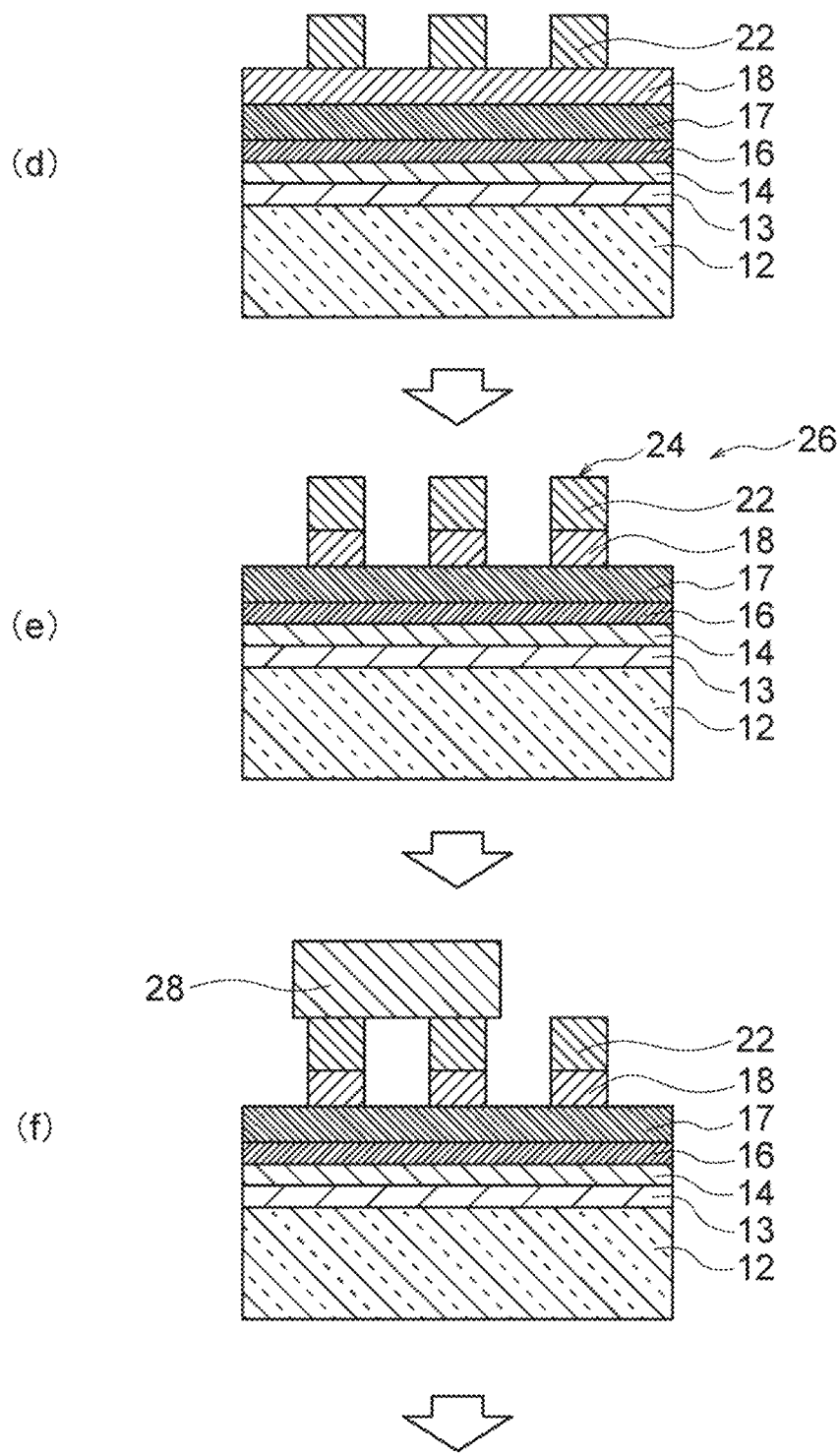
FIG. 3 is a process flow chart for explaining middle steps (steps (d) to (f)) following FIG. 2 of a method for manufacturing a coreless support provided with a wiring layer or a printed wiring board of the present invention.

A coreless support provided with a wiring layer can be manufactured using a copper foil provided with a carrier of the present invention. Hereinafter, a preferred method of manufacturing a coreless support provided with a wiring layer will be described. The method of manufacturing a coreless support provided with a wiring layer includes steps of: (1) providing a copper foil provided with a carrier, (2) forming a photoresist layer, (3) forming an electrolytic copper plating layer, (4) peeling off the photoresist layer, and (5) flash etching. The production of a coreless support provided with a wiring layer including these steps is schematically shown in FIGS. 2 and 3.

(1) Provision of Copper Foil Provided with Carrier.

A support for the copper foil 10 provided with a carrier is provided (see FIG. 2(a)). As described above, the copper foil 10 provided with a carrier can be provided in the form of a laminate for a coreless support. In other words, as described above, the copper foil provided with a carrier may be provided in a form of a carrier foil itself, or may be provided in a form having an adhesive layer on the outer surface of the carrier 12 (the outer surface of the carrier 12 being remote from the release layer 16), for example, in a form of a layer structure of an extremely-thin copper layer 18, an antireflective layer 17, a release layer 16, a release assisting layer 14, an adhesive metal layer 13, a carrier 12, an adhesive layer (not shown), a carrier 12, an adhesive metal layer 13, a release assisting layer 14, a release layer 16, an antireflective layer 17, and an extremely-thin copper layer 18.

(2) Formation of Photoresist Layer

A photoresist layer 20 is formed in a predetermined pattern on the surface of the extremely-thin copper layer 18 (see FIG. 2(b)). The photoresist is preferably a photosensitive film, for example, a photosensitive dry film. The photoresist layer 20 may be provided with a predetermined wiring pattern by exposure and development.

(3) Formation of Electrolytic Copper Plating Layer

An electrolytic copper plating layer 22 is formed on the exposed surface of the extremely-thin copper layer 18 (i.e., the portion not masked with the photoresist layer 20) (see FIG. 2(c)). The electrolytic copper plating can be carried out by any known process without any limitation.

(4) Peeling-Off of Photoresist Layer

The photoresist layer 20 is then peeled off. As shown in FIG. 3(d), the electrolytic copper plating layer 22 remains in the form of a wiring pattern, and the portions of extremely-thin copper layer 18 where the wiring pattern is not formed are exposed.

(5) Copper Flash Etching

Unnecessary portions of the extremely-thin copper layer 18 are removed by copper flash etching to expose the antireflective layer 17, resulting in a coreless support (hereinafter referred to as a coreless support 26 provided with a wiring layer) on which the wiring layer 24 is formed. The flashing etching solution is preferably a mixture of sulfuric acid and hydrogen peroxide or a solution containing at least one of sodium persulfate and potassium persulfate. These solutions can reliably etch the exposed portions of the extremely-thin copper layer 18 without excess etching of the electrolytic copper plating layer 22. Thus, as shown in FIG. 3(*e*), the electrolytic copper plating layer 22 and the extremely-thin copper layer 18 remain in the form of a wiring pattern, while portions of the antireflective layer 17 where the wiring pattern is not formed are not etched away by the flash etching solution to be exposed on the surface. At least one metal selected from Cr, W, Ta, Ti, Ni, and Mo constituting the antireflective layer 17 cannot be etched away in the copper flash etching solution, and thus exhibits high chemical resistance against the copper flash etching solution. In other words, the antireflective layer 17 is not removed during copper flash etching but is left in the exposed state for the next image inspection process.

(6) Image Inspection and Other Steps. (Optional Process)

After the copper flash etching, it is preferred that the image of the coreless support 26 provided with a wiring layer (specifically, the wiring layer 24) be inspected while the antireflective layer 17 remains exposed. Typically, the image is inspected as follows: a binary image of a wiring pattern is acquired with an automatic optical inspection (AOI) system by irradiating the support with predetermined light from a light source. Pattern matching between the binary image and the design data image is then carried out to evaluate match or mismatch between these images. The aggregate of metal particles constituting at least the surface of the antireflective layer 17 exhibits a desirable dark color due to the metallic material and granular form, leading to a desirable visual contrast to the wiring layer 24 composed of copper, resulting in improved visibility in image inspection (e.g., automatic optical inspection (AOI)).

After the above image inspection, it is preferred to mount an electronic element 28, such as a chip, on the coreless support 26 provided with a wiring layer, if necessary.

A printed wiring board can thereby be manufactured. As described above, such a process of mounting the chip after forming the wiring layer 24 is called RDL-first process. This method enables image inspection of the wiring layer on the surface of the coreless support and each built-up wiring layer stacked thereafter, prior to chip mounting, so that the chip may be mounted only on the non-defective portion of each wiring layer. As a result, the RDL-first method, which can avoid wasteful use of the chips, is economically advantageous compared to the Chip-first method, which sequentially stacks the wiring layer on the surface of the chip. In this respect, in the copper foil 10 provided with a carrier of the present invention, adoption of the antireflective layer 17, which is composed of a predetermined metal and has a surface adjacent to the extremely-thin copper layer 18 composed of an aggregate of metal particles, provides sufficient contrast between the surface of the electrolytic copper plating layer 22 and the surface of the antireflective layer 17 in image inspection, resulting in high-accuracy image inspection. Accordingly, for example, the binary images of the wiring pattern acquired by the automatic optical inspection (AOI) system are more accurate and clear. Thus, in the process of manufacturing a printed wiring board (in particular, the RDL-first process), images on a wiring layer before chip mounting can be inspected with high accuracy, resulting in improved product yield. Examples of the optional electronic element 28 mounted on the wiring layer of the coreless support 26 include a semiconductor element, a chip capacitor, and a resistor. Examples of a method of mounting electronic elements include a flip chip mounting method and a die bonding method. The flip chip mounting method involves welding the mounting pad of the electronic elements 28 to the wiring layer 24 on the coreless support 26. Columnar electrodes (pillars) and solder bumps a may be formed on this mounting pad. A sealing resin film such as non-conductive film (NCF) may be attached to the surface of the wiring layer 24 of the coreless support 26 before mounting. Although the welding is preferably performed using a low melting point metal such as solder, an anisotropic conductive film may be used. In the die bonding method, the surface opposite to the mounting pad surface of the electronic element 28 is bonded to the wiring layer 24 on the surface of the coreless support 26. For this bonding, it is preferred to use a paste or a film composed of a resin composition containing a thermosetting resin and a thermally conductive inorganic filler.

Production of Printed Wiring Board

Figure 4:
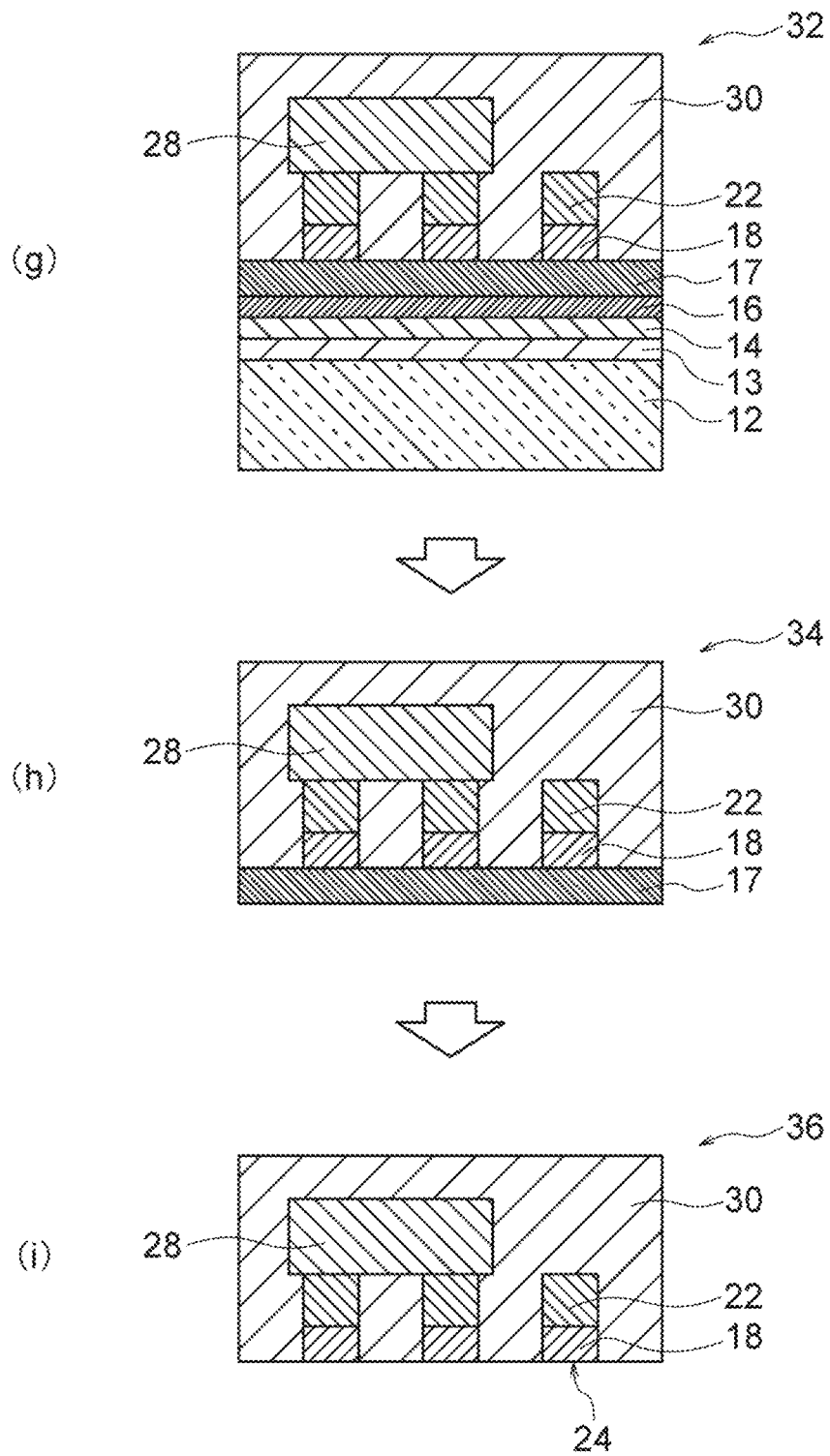
FIG. 4 is a process flow chart for explaining final steps (steps (g) to (i)) following FIG. 3 of a method for manufacturing a printed wiring board of the present invention.

The printed wiring board can be manufactured using the coreless support provided with the wiring layer of the present invention. Hereinafter, a preferred manufacturing method of the printed wiring board will be described. The method of manufacturing this printed wiring board involves the steps of (1) manufacturing a coreless support provided with a wiring layer, (2) preparing a laminate with a build-up layer, (3) separating the laminate with a build-up layer, and (4) removing the antireflective layer. A method of manufacturing a printed wiring board including these steps is schematically shown in FIGS. 2 to 4 (particularly, FIG. 4).

(1) Step of Manufacturing Coreless Support Provided with Wiring Layer

The coreless support 26 provided with a wiring layer is manufactured by the method of the present invention described above. In other worlds, the production of the printed wiring board of the present invention includes a series of steps of the above-described method of manufacturing a coreless support provided with a wiring layer, and the repetitive description thereof will be omitted.

(2) Step of Preparing Laminate with Build-Up Layer

The build-up layer 30 is formed on the surface of the coreless support 26 provided with a wiring layer on which the wiring layer 24 is formed to prepare a laminate 32 with a build-up layer (see FIG. 4(*g*)). Although details of the build-up layer 30 are not shown in FIG. 4, any known build-up wiring layer structure commonly used in printed wiring boards may be adopted.

(3) Step of Separating Laminate with Build-Up Layer

The multilayer wiring board 34 including the build-up layer 30 is prepared by separating the laminate 32 with build-up layer with the release layer 16. That is, the carrier 12, the adhesive metal layer 13 (if present), the release assisting layer 14 (if present), and the release layer 16 are peeled off. The separation step such as physical separation and chemical separation can be adopted. The physical separation involves separating the carrier 12 from the build-up layer 30 with hands, a tool, or a machine to prepare the multilayer wiring board 34 (see FIG. 4(*h*)). In the case where the chemical separation method is adopted (especially when the adhesive metal layer 13 and the peeling assisting layer 14 are not provided), the multilayer wiring board 34 can be prepared using the carrier etching solution that etches away the carrier 12. It is preferred to carry out etching with a carrier etching solution which is a chemical solution capable of etching away the carrier 12 and not etching away the members constituting the build-up layer 30. For example, if the carrier is glass, it is preferred that the carrier is etched away to separate using a glass etching solution such as hydrofluoric acid or acidic ammonium fluoride. The chemical separation method is effective if the portion where the build-up layer 30 directly contacts the carrier 12 is widely and strongly bonded.

(4) Step of Removing Antireflective Layer

The antireflective layer 17 is removed by flash etching to prepare a printed wiring board 36 (FIG. 4(*i*)). The appropriate etching solution for the flash etching is preferably selected according to the metal constituting the antireflective layer 17, for example, as exemplified in the Table 1 below. Representative etching solutions are exemplified in Table 1, but the present invention is not limited thereto, and the conditions such as the type and concentration of acid and ammonium salt, and temperature can be appropriately varied from the conditions shown in Table 1.

TABLE 1

| Constituent element of antireflective layer | Desirable components contained in etching solution | Desirable etching temperature |
| --- | --- | --- |
| Cr | $HNO_3$ (5%) and cerium(IV) ammonium hexanitrate (CAN)(20%) | 40° C. |
| W | $H_2O_2$ (30%), triammonium citrate (5%) and $NH_3$ (0.1%) | 30° C. |
| Ta | NaOH (30%) | 70 to 80° C. |
| Ti | $H_2O_2$ (30%), triammonium citrate (5%) and $NH_3$ (0.1%) | 30° C. |
| Ni | $HNO_3$ (20%) and $H_2O_2$ (10%) | 40° C. |
| Mo | $H_3PO_4$, $HNO_3$ and $CH_3COOH$ | 23° C. |

The antireflective layer 17 can be selectively flash-etched with such an etching solution, so that erosion of the wiring layer 24 (which is composed of copper) exposed under the antireflective layer 17 can be significantly prevented. In other words, a highly selective etching solution may be used in flash etching of at least one metal selected from Cr, W, Ta, Ti, Ni and Mo constituting the antireflective layer 17 to reduce or prevent etching of the copper from the wiring layer 24 in the etching solution.

The outer layer of the printed wiring board 36 as shown in FIG. 4 can be processed by various methods. For example, an insulating layer and a wiring layer as build-up wiring layers may be stacked on the wiring layer 24 of the printed wiring board 36 as any number of layers, or a solder resist layer may be formed on the surface of the wiring layer 24 to perform surface treatment as an outer layer pad such as Ni—Au plating or OSP treatment (water soluble preflux treatment, Organic Solderability Preservative). Furthermore, a columnar pillar and other features may be provided on the outer layer pad. In any case, in general, any known method employed in a printed wiring board can be additionally carried out.

EXAMPLES

The present invention will be described in further detail by way of the following examples.

Example 1

(1) Preparation of Copper Foil Provided with Carrier

As shown in FIG. 1, an adhesive metal layer 13, release assisting layer 14, a release layer 16, and an extremely-thin copper layer 18 were deposited in this order on a glass sheet carrier 12 to prepare a copper foil 10 provided with a carrier. The detailed procedures are as follows. The arithmetic average roughness Ra in the following examples is measured with a non-contact profilometer (NewView 5032 manufactured by Zygo Corporation) in accordance with JIS B 0601-2001.

(1a) Provision of Carrier

A glass sheet (material: non-alkali glass, product name: OA 10, manufactured by Nippon Electric Glass Co., Ltd.) having a thickness of 700 μm and a surface with an arithmetic average roughness Ra of 0.5 nm was provided.

The end faces of the carrier 12 were masked with a stainless steel plate, and various layers were formed by sputtering as described below.

(1b) Formation of Adhesive Metal Layer

A titanium adhesive metal layer 13 having a thickness of 100 nm was deposited on the surface of the carrier 12 by sputtering under the following conditions:
- Apparatus: single-wafer type magnetron sputtering system (manufactured by Tokki Corporation)
- Target: Ti target (purity: 99.999%) with a diameter of 8 inches (203.2 mm)
- Ultimate vacuum Pu: less than $1 \times 10^{-4}$ Pa
- Carrier gas: Ar (flow rate: 100 sccm)
- Sputtering pressure: 0.35 Pa
- Sputtering power: 2,000 W (6.2 W/cm$^2$)
- Temperature during deposition: 40° C.

(1c) Formation of Release Assisting Layer

A copper release assisting layer 14 having a thickness of 100 nm was deposited on the surface on the adhesive metal layer 13 by sputtering under the following conditions:
- Apparatus: single wafer type DC sputtering system (MLS 464 manufactured by Canon Tokki Corporation)
- Target: Cu target (purity: 99.98%) with a diameter of 8 inches (203.2 mm)
- Ultimate vacuum Pu: less than $1 \times 10^{-4}$ Pa
- Carrier gas: Ar (flow rate: 100 sccm)
- Sputtering pressure: 0.35 Pa
- Sputtering power: 2,000 W (6.2 W/cm$^2$)
- Temperature during deposition: 40° C.

(1d) Formation of Release Layer

An amorphous carbon layer having a thickness of 3 nm as a release layer 16 was deposited on the release assisting layer 14 by sputtering under the following conditions:
- Apparatus: single wafer type DC sputtering system (MLS 464 manufactured by Canon Tokki Corporation)
- Target: carbon target (purity: 99.999%) with a diameter of 8 inches (203.2 mm)
- Ultimate vacuum Pu: less than $1 \times 10^{-4}$ Pa
- Carrier gas: Ar (flow rate: 100 sccm)
- Sputtering pressure: 0.35 Pa
- Sputtering power: 100 W (0.3 W/cm$^2$)
- Temperature during deposition: 40° C.

(1e) Formation of Antireflective Layer

A nickel antireflective layer 17 having a thickness of 100 nm was deposited on the surface of the release layer 16 by sputtering under the following conditions:
- Apparatus: single wafer type DC sputtering system (MLS 464 manufactured by Canon Tokki Corporation)
- Target: Ni target (Ni: 100 wt %) with a diameter of 8 inches (203.2 mm) and a thickness of 1 mm
- Ultimate vacuum Pu: less than $1 \times 10^{-4}$ Pa
- Carrier gas: Ar (flow rate: 100 sccm)
- Sputtering pressure: 12 Pa
- Sputtering power: 2,000 W (6.2 W/cm$^2$)
- Temperature during deposition: 40° C.

(1f) Formation of Extremely-Thin Copper Layer

An extremely-thin copper layer 18 having a thickness of 300 nm was deposited on the antireflective layer 17 under the following conditions. The surface remote from the release layer 16 (i.e., the outer surface) of the resulting extremely-thin copper layer 18 had an arithmetic average roughness Ra of 3 nm.

Apparatus: single wafer type DC sputtering system (MLS 464 manufactured by Canon Tokki Corporation)
Target: Cu target (purity: 99.98%) with a diameter of 8 inches (203.2 mm)
Ultimate vacuum Pu: less than $1 \times 10^{-4}$ Pa
Carrier gas: Ar (flow rate: 100 sccm)
Sputtering pressure: 0.35 Pa
Sputtering power: 2,000 W (6.2 W/cm$^2$)
Temperature during deposition: 40° C.

(1g) Components Analysis and Measurement of Projected Area Circle Equivalent Diameter The samples for, for example, components analysis are prepared under the same conditions as those of manufacturing the adhesive metal layer 13, release assisting layer 14, release layer 16, and antireflective layer 17 of the resulting copper foil provided with carrier: that is, a first sample provided with only an adhesive metal layer 13 on a glass sheet, a second sample provided with only a release assisting layer 14 on a glass sheet, a third sample provided with only a release layer 16 on a glass sheet, and a fourth sample provided with only an antireflective layer 17 on a glass sheet were separately prepared. Components of each sample were analyzed as follows to determine the components of each layer.

<Components Analyses of Adhesive Metal Layer, Release Assisting Layer, and Antireflective Layer>

Monitoring samples for surface analysis were prepared for the adhesive metal layer 13, the release assisting layer 14, and the antireflective layer 17 to perform elemental analysis by time-of-flight secondary ion mass spectrometry (TOF-SIMS). This measurement was carried out in a constant current mode under the condition of 800 V and 3 mA. The results of the compositions of the adhesive metal layer 13, the release assisting layer 14 and the antireflective layer 17 were as follows.

Adhesive metal layer 13: 92.5 atom % Ti, 7.5 atom % O
Release assisting layer 14: 99 atom % Cu, 1 atom % O
Anti-reflective layer 17: 99.6 atom % Ni, 0.4 atom % O <Components Analysis of Release Layer>

Elemental analysis was performed on the release layer 16 (i.e., the carbon layer) by XPS to determine the carbon content. The release layer 16 had a carbon content of 93 atom % (C+O=100%).

<Measurement of Surface Shape and Projected Area Circle Equivalent Diameter of Antireflective Layer Surface>

The sample immediately after the formation of the antireflective layer 17 was taken out, and the surface of the antireflective layer 17 was photographed at a magnification of 50,000 with a scanning electron microscope to acquire an SEM image. The surface shape was specified by image analysis of the binary image from the acquired SEM image to determine the average value of the projected area circle equivalent diameters for the particles within an arbitrary field of view range of 2 µm×1 µm on the particle surface. The image analysis was performed with image analysis type particle size distribution software (Mac-VIEW, manufactured by Mountech Co., Ltd.). For arbitrary 50 or more particles, the projected area circle equivalent diameter was measured for individual particles to calculate the arithmetic mean value thereof. The results are shown in Table 2.

Examples 2 to 5

Copper foils provided with carriers were prepared and evaluated as in Example 1 except that a titanium antireflective layer 17 was formed instead of the nickel layer in the following manner. The results are shown in Table 2. The arithmetic average roughness Ra of the surface remote from the release layer 16 of the extremely-thin copper layer 18 was 3.7 nm. The composition of each layer other than the antireflective layer 17 was substantially the same as that in Example 1. The antireflective layer 17 has a composition of 85 atom % Ti, 15 atom % O (Example 2), 91 atom % Ti, 9 atom % O (Example 3), 90 atom % Ti, 10 atom % O (Example 4), 87 atom % Ti, and 13 atom % O (Example 5).

(Formation of Titanium Layer)

A titanium antireflective layer 17 having a thickness of 100 nm was deposited on the surface of the release layer 16 by sputtering under the following conditions:

Apparatus: single wafer type DC sputtering system (MLS 464 manufactured by Canon Tokki Corporation)
Target: Ti target (purity: 99.999%) with a diameter of 8 inches (203.2 mm)
Carrier gas: Ar (flow rate: 100 sccm)
Ultimate vacuum Pu: less than $1 \times 10^{-4}$ Pa
Carrier gas: Ar (flow rate: 100 sccm)
Sputtering pressure: 12 Pa (Examples 2 and 4), 4 Pa (Example 3) or 0.5 Pa (Example 5)
Sputtering power: 2,000 W (6.2 W/cm$^2$) (Example 2) or 1,000 W (3.1 W) (Examples 3 to 5)

Example 6

A copper foil provided with a carrier was prepared and evaluated as in Example 1 except that a chromium antireflective layer 17 was formed instead of the nickel layer in the following manner. The results are shown in Table 2. The arithmetic average roughness Ra of the surface remote from the release layer 16 of the extremely-thin copper layer 18 was 3.5 nm. The composition of each layer other than the antireflective layer 17 was substantially the same as that in Example 1. The antireflective layer 17 had a composition of 98 atom % Cr and 2 atom % O.

(Formation of Chromium Layer)

A chromium antireflective layer 17 having a thickness of 100 nm was deposited on the surface of the release layer 16 by sputtering under the following conditions:

Apparatus: single wafer type DC sputtering system (MLS 464 manufactured by Canon Tokki Corporation)
Target: Cr target (Cr: 99.9%) with a diameter of 8 inches (203.2 mm) and a thickness of 6 mm
Carrier gas: Ar (flow rate: 100 sccm)
Ultimate vacuum Pu: less than $1 \times 10^{-4}$ Pa
Sputtering pressure: 12 Pa
Sputtering power: 2,000 W (6.2 W/cm$^2$)

Example 7

A copper foil provided with a carrier was prepared and evaluated as in Example 1 except that a tungsten antireflective layer 17 was formed instead of the nickel layer in the following manner. The results are shown in Table 2. The arithmetic average roughness Ra of the surface remote from the release layer 16 of the extremely-thin copper layer 18 was 3.1 nm. The composition of each layer other than the antireflective layer 17 was substantially the same as that in Example 1. The antireflective layer 17 had a composition of 99 atom % W and 1 atom % O.

(Formation of Tungsten Layer)

A tungsten antireflective layer 17 having a thickness of 100 nm was deposited on the surface of the release layer 16 by sputtering under the following conditions:

Apparatus: single wafer type DC sputtering system (MLS 464 manufactured by Canon Tokki Corporation)
Target: W target (W: 99.9 wt %) with a diameter of 8 inches (203.2 mm) and a thickness of 4 mm.
Ultimate vacuum Pu: less than $1 \times 10^{-4}$ Pa
Carrier gas: Ar (flow rate: 100 sccm)
Sputtering pressure: 4 Pa
Sputtering power: 2000 W (6.2 W/cm$^2$)

Example 8

A copper foil provided with a carrier was prepared and evaluated as in Example 1 except that a tantalum antireflective layer 17 was formed instead of the nickel layer in the following manner. The results are shown in Table 2. The arithmetic average roughness Ra of the surface remote from the release layer 16 of the extremely-thin copper layer 18 was 3.2 nm. The composition of each layer other than the antireflective layer 17 was approximately the same as that in Example 1. The antireflective layer 17 had a composition of 99 atom % Ta and 1 atom % O.

(Formation of Tantalum Layer)

A tantalum antireflective layer 17 having a thickness of 100 nm was deposited on the surface of the peeling layer 16 by sputtering under the following conditions:

Apparatus: Single wafer type DC sputtering system (MLS 464 manufactured by Canon Tokki Corporation)
Target: Ta target (Ta: 99.99%) with a diameter of 8 inches (203.2 mm) and a thickness of 4 mm
Carrier gas: Ar (flow rate: 100 sccm)
The ultimate degree of vacuum Pu: less than $1 \times 10^{-4}$ Pa
Sputtering pressure: 4 Pa
Sputtering power: 2000 W (6.2 W/cm$^2$)

Example 9

A copper foil provided with a carrier was prepared and evaluated as in Example 1 except that a molybdenum antireflective layer 17 was formed instead of the nickel layer in the following manner. The results are shown in Table 2. The arithmetic average roughness Ra of the surface remote from the release layer 16 of the extremely-thin copper layer 18 was 3.0 nm. The composition of each layer other than the antireflective layer 17 was substantially the same as that in Example 1. The antireflective layer 17 had a composition of 99.1 atom % Mo and 0.9 atom % O.

(Formation of Molybdenum Layer)

A molybdenum antireflective layer 17 having a thickness of 100 nm was deposited on the surface of the peeling layer 16 by sputtering under the following conditions:

Apparatus: Single wafer type DC sputtering system (MLS 464 manufactured by Canon Tokki Corporation)
Target: Mo target (Mo: 99.99%) with a diameter of 8 inches (203.2 mm) and a thickness of 6 mm
Carrier gas: Ar (flow rate: 100 sccm)
The ultimate degree of vacuum Pu: less than $1 \times 10^{-4}$ Pa
Sputtering pressure: 4 Pa
Sputtering power: 2,000 W (6.2 W/cm$^2$)

Example 10 (Comparative)

A copper foil provided with a carrier was prepared and evaluated as in Example 1 except that an aluminum antireflective layer 17 was formed instead of the nickel layer in the following manner. The results are shown in Table 2. The arithmetic average roughness Ra of the surface remote from the release layer 16 of the extremely-thin copper layer 18 was 5.1 nm. The composition of each layer other than the antireflective layer 17 was substantially the same as that in Example 1. The antireflective layer 17 had a composition of 99.4 atom % Al and 0.6 atom % O.

(Formation of Aluminum Layer)

An aluminum antireflective layer 17 having a thickness of 100 nm was deposited on the surface of the release layer 16 by sputtering under the following conditions:

Apparatus: single wafer type DC sputtering system (MLS 464 manufactured by Canon Tokki Corporation)
Target: Al target (Al: 99.999%) with a diameter of 8 inches (203.2 mm) and a thickness of 8 mm
Carrier gas: Ar (flow rate: 100 sccm)
Ultimate vacuum Pu: less than $1 \times 10^{-4}$ Pa
Sputtering pressure: 12 Pa
Sputtering power: 1,000 W (3.1 W/cm$^2$)

Example 11 (Comparative)

A copper foil provided with a carrier was prepared and evaluated as in Example 1 except that a silver antireflective layer 17 was formed instead of the nickel layer in the following manner. The results are shown in Table 2. The arithmetic average roughness Ra of the surface remote from the release layer 16 of the extremely-thin copper layer 18 was 8.5 nm. The composition of each layer other than the antireflective layer 17 was substantially the same as that in Example 1. The antireflective layer 17 had a composition of 99.8 atom % Ag and 0.2 atom % O.

(Formation of Silver Layer)

A silver antireflective layer 17 having a thickness of 100 nm was deposited on the surface of the release layer 16 by sputtering under the following conditions:

Apparatus: single wafer type DC sputtering system (MLS 464 manufactured by Canon Tokki Corporation)
Target: Ag target (Ag: 99.9%) with a diameter of 8 inches (203.2 mm) and a thickness of 8 mm
Carrier gas: Ar (flow rate: 100 sccm)
Ultimate vacuum Pu: less than $1 \times 10^{-4}$ Pa
Sputtering pressure: 12 Pa
Sputtering power: 1,000 W (3.1 W/cm$^2$)

Example 12 (Comparative)

A copper foil provided with a carrier was prepared and evaluated as in Example 1 except that a nickel antireflective layer 17 was formed into a film-like surface shape (not in the form of particles) in the following manner. The results are shown in Table 2. The arithmetic average roughness Ra of the surface remote from the release layer 16 of the extremely-thin copper layer 18 was 2.7 nm. The composition of each layer other than the antireflective layer 17 was substantially the same as that in Example 1. The antireflective layer 17 had a composition of 99.5 atom % Ni and 0.5 atom % O.

(Formation of Nickel Layer)

A nickel antireflective layer 17 having a thickness of 100 nm was deposited on the surface of the release layer 16 by sputtering under the following conditions:

Apparatus: single wafer type DC sputtering system (MLS 464 manufactured by Canon Tokki Corporation)
Target: Ni target (Ni: 100 wt %) with a diameter of 8 inches (203.2 mm) and a thickness of 1 mm Carrier gas: Ar (flow rate: 100 sccm)
Ultimate vacuum Pu: less than $1\times10^{-4}$ Pa
Sputtering pressure: 0.08 Pa
Sputtering power: 1,000 W (3.1 W/cm$^2$)

Example 13 (Comparative)

A copper foil provided with a carrier was prepared and evaluated as in Example 1 except that a titanium antireflective layer 17 was formed into a film-like surface shape (not in the form of particles) in the following manner. The results are shown in Table 2. The arithmetic average roughness Ra of the surface remote from the release layer 16 of the extremely-thin copper layer 18 was 2.7 nm. The composition of each layer other than the antireflective layer 17 was substantially the same as that in Example 1. The antireflective layer 17 had a composition of 92 atom % Ti and 8 atom % O.

(Formation of Titanium Layer)

A Ti antireflective layer 17 having a thickness of 100 nm was deposited on the surface of the release layer 16 by sputtering under the following conditions:
Apparatus: single wafer type DC sputtering system (MLS 464 manufactured by Canon Tokki Corporation)
Target: Ti target (purity: 99.999%) with a diameter of 8 inches (203.2 mm)
Carrier gas: Ar (flow rate: 100 sccm)
Ultimate vacuum Pu: less than $1\times10^{-4}$ Pa
Sputtering pressure: 0.05 Pa
Sputtering power: 1,000 W (3.1 W/cm$^2$)

Example 14 to 18

A copper foil provided with a carrier was prepared as in Example 2, except that i) an adhesive metal layer 13, a release assisting layer 14, an antireflective layer 17, and an extremely-thin copper layer 18 were formed without masking the end face of a carrier 12, and ii) a release layer 16 with a variable thickness (end face thickness) was formed using a stainless steel plate. As a result, the thickness (end face thickness) of each layer at the end face of the carrier 12 was as shown below.
Adhesive metal layer 13: titanium layer (end surface thickness: 35 nm)
Release assisting layer 14: copper layer (end face thickness: 35 nm)
Release layer 16: carbon layer (various end face thicknesses shown in Table 3)
Antireflective layer 17: titanium layer (end face thickness: 38 nm)
Extremely-thin copper layer 18: copper layer (end face thickness: 100 nm)
Evaluations on Various Items
The copper foil provided with a carrier of each of Examples 1 to 18 was subjected to evaluation on the following items. The results are shown in Table 2A, 2B and 3.

<Peeling Resistance Against Developer>

The surface of the extremely-thin copper layer of each copper foil provided with a carrier was treated with dilute sulfuric acid of 0.05 mol/L to remove the oxide film on the surface, followed by washing with water and drying. Then, a photosensitive dry film was attached to the surface of the extremely-thin copper layer, and exposed and developed such that a pattern of line/space (L/S)=5 μm/5 μm is given. Development was carried out by showering at 25° C. for 2 min using an aqueous 1.0 wt % sodium carbonate developer. The presence of peeling (or degree of separation) of the extremely-thin copper layer due to infiltration of the developer into the interface between the extremely-thin copper layer and the carrier (especially between the release layer and the adhesive metal layer) after the development was evaluated. The results were rated based on the following criteria.

Rank A: No peeling of the extremely-thin copper layer was observed.
Rank B: Peeling with a size of 50 μm or less in diameter was observed.
Rank C: Peeling with a size larger than 50 μm in diameter was observed.

<Chemical Resistance of Antireflective Film During Flash Etching of Extremely-Thin Copper Layer>

Copper flash etching was performed such that the coreless support provided with a wiring layer (the extremely-thin copper layer is exposed between the pattern formed wirings) after the development is immersed in an etching solution containing a mixture of sulfuric acid and hydrogen peroxide at 23° C. for 5 min at a shower pressure of 0.1 MPa. In this way, the extremely-thin copper layer exposed between the patterned wirings was removed. The coreless support provided with a wiring layer after the flash etching was observed to evaluate the chemical resistance of the antireflective layer. The results were rated based on the following criteria.

Rank A: The antireflective layer remained without disappearance.
Rank B: The antireflective layer partially disappeared.
Rank C: The antireflective layer disappeared over the entire surface, and a part of the wiring was detached.

The following evaluation of the surface glossiness and the evaluation of the AOI visibility of the sample of Example 10 were abandoned because the antireflective film disappeared during flash etching of the extremely-thin copper layer in the above evaluation.

<Surface Glossiness Gs (60°) of Antireflective Layer After Flash Etching of Extremely-Thin Copper Layer>

Examples 1 to 9 and 11 to 13 were tested for glossiness at an angle of 60° using a gloss meter (PG-1M, Nippon Denshoku Industries Co., Ltd.) in accordance with JIS Z 8741 (1997) (specular glossiness-measuring method) with respect to a portion where the antireflective layer was exposed (a portion where no wiring pattern exists) on the surface of the coreless support after the above-described copper flash etching.

<AOI Visibility of Wiring>

Examples 1 to 9 and 11 to 13 were tested for the visibility of the wiring pattern by the following procedure. An automatic optical inspector (AOI) (product name: PI 9500, manufactured by Dainippon Screen Mfg. Co., Ltd.) was prepared which was equipped with a light source of red LED of 635 nm. The surface on the side having the wiring layer of the coreless support provided with the wiring layer after the copper flash etching was scanned to create a luminance histogram and provide a threshold allowing identification of the space and the wiring. The threshold was set to the median value between the respective peak ends between the peak $P_S$ derived from the space (gap portion) and the peak $P_L$ derived from the line (wiring portion) (i.e., between the end of the peak corresponding to the gap part and the starting point of the peak corresponding to the wiring part) of the luminance histogram. Based on this threshold value, the circuit surface on which the wiring pattern was formed was scanned to identify lines and spaces for pattern matching with design data. The results were rated based on the following four criteria.

Rank AA: Strictly exact line/space image (hereinafter referred to as L/S image) as designed.

Rank A: Substantially exact L/S image

Rank B: Acceptable L/S image

Rank C: Unidentified line and space

Figure 5:
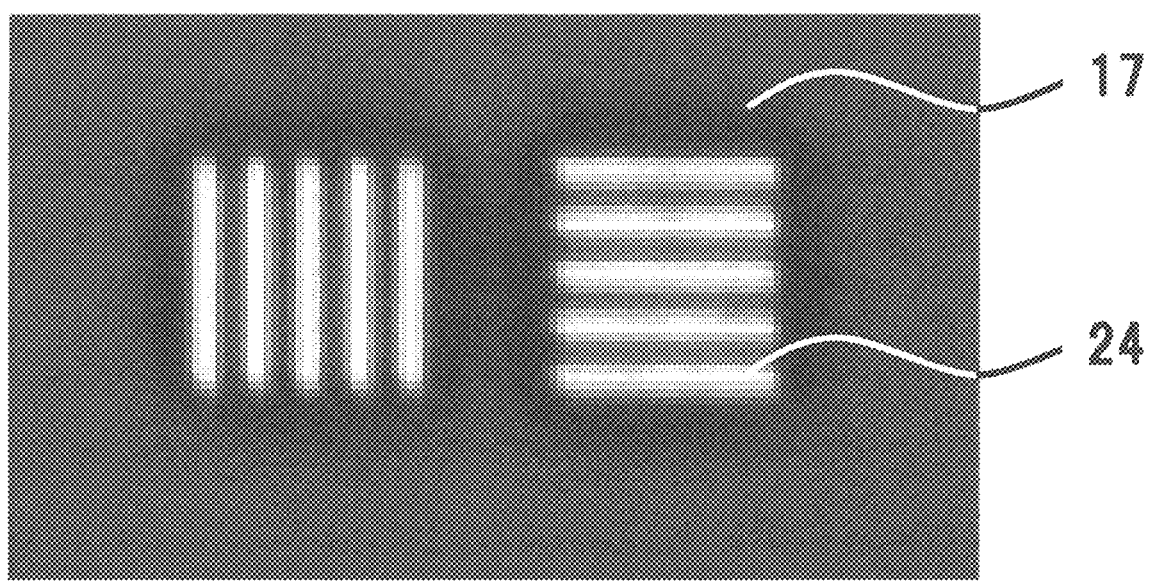
FIG. 5 is a binary image taken by scanning the wiring pattern produced in Example 2 with an automatic optical inspection (AOI) system.

The wiring pattern of Example 2, which exhibits the good visibility of the wiring pattern, was scanned with an automatic optical inspector (AOI) to be binary. The resulting binary image is shown in FIG. 5.

Process conditions: immersion for 5 min at 75° C.

[Permanganic Acid Process]

Process solution: Circuposit MLB promoter 213A (110 mL/L) and
Circuposit MLB promoter 213 B (150 mL/L)

Process conditions: immersion for 5 min at 80° C.

[Neutralization Process]

Process solution: Circuposit MLB Neutralizer 216-2 (200 mL/L)

Process conditions: immersion for 5 min at 45° C.

The measured chemical penetration depth (mm) was rated based on the following criteria. The results are shown in Tables 2B and 3.

Rank AA: less than 0.1 mm (best)

Rank A: 0.1 mm or more and less than 0.5 mm (good)

Rank B: 0.5 mm or more and less than 2 mm (acceptable)

Rank C: 2 mm or more (unacceptable)

TABLE 2A

| | | | | | Antireflective layer | | Chemical resistance of antireflective layer during flash etching of extremely-thin copper layer | Surface glossiness Gs (60°) of antireflective layer after extremely-thin copper layer flash etching | AOI visibility of wiring |
|---|---|---|---|---|---|---|---|---|---|
| | Constituent element | Sputtering pressure (Pa) | Sputtering power (W/cm²) | Surface shape | Projected area circle equivalent diameter of surface (nm) | Peeling resistance against developer (μm) | | | |
| Ex. 1 | Ni | 12 | 6.2 | Particulate | 60 | 0(A) | A | 314 | A |
| Ex. 2 | Ti | 12 | 6.2 | Particulate | 86 | 0(A) | A | 269 | AA |
| Ex. 3 | Ti | 4 | 3.1 | Particulate | 38 | 0(A) | A | 367 | A |
| Ex. 4 | Ti | 12 | 3.1 | Particulate | 52 | 30(B) | A | 312 | A |
| Ex. 5 | Ti | 0.5 | 3.1 | Particulate | 21 | 50(8) | A | 726 | B |
| Ex. 6 | Cr | 12 | 6.2 | Particulate | 81 | 0(A) | A | 251 | AA |
| Ex. 7 | W | 4 | 6.2 | Particulate | 45 | 0(A) | A | 344 | A |
| Ex. 8 | Ta | 4 | 6.2 | Particulate | 38 | 0(A) | A | 351 | A |
| Ex. 9 | Mo | 4 | 6.2 | Particulate | 61 | 0(A) | A | 389 | A |
| Ex. 10* | Al | 12 | 3.1 | Filmy | 73 | 98(C) | C | — | — |
| Ex. 11* | Ag | 12 | 3.1 | Filmy | 89 | 110(C) | A | 970 | C |
| Ex. 12* | Ni | 0.08 | 3.1 | Filmy | 8 | 0(A) | A | 620 | C |
| Ex. 13* | Ti | 0.05 | 3.1 | Filmy | 5 | 0(A) | A | 515 | C |

*denotes comparative examples.

<Evaluation of Film Chipping at Side Ends of Coreless Support>

The maximum width (mm) of chipping of the film (i.e., extremely-thin copper layer and antireflective layer) on the release layer at the side ends of each coreless support provided with a wiring pattern was measured to be rated based on the following criteria. The results are shown in Tables 2B and 3.

Rank AA: Less than 0.1 mm (best)

Rank A: 0.1 mm or more and less than 1 mm (good)

Rank B: 1 mm or more and less than 2 mm (acceptable)

Rank C: 2 mm or more (unacceptable)

<Evaluation of Chemical Penetration Depth>

A prepreg having a size of 100 mm×100 mm (FR-4 manufactured by Panasonic Corporation, 200 μm thick) was laminated on the coreless support with a wiring pattern to cure the prepreg into a printed wiring board. The printed wiring board was subjected to desmear treatment using a sodium permanganate solution, and the chemical penetration depth (mm) was measured as an indication of the penetrated amount of chemical solution.

This desmear treatment was carried out by the following procedures using the process solution shown below (manufactured by Rohm and Haas Electronic Materials LLC).

[Swelling Process]

Process solution: Circuposit MLB Conditioner 211 (120 mL/L) and
Circuposit Z (100 mL/L)

TABLE 2B

| | Chipping width of extremely-thin copper layer and other layers at side ends (mm) | Chemical penetration depth (mm) |
|---|---|---|
| Ex. 1 | 1.5(B) | 0.5(B) |
| Ex. 2 | 1.0(B) | 0.5(B) |
| Ex. 3 | 1.5(B) | 1.0(B) |
| Ex. 4 | 1.0(B) | 1.5(B) |
| Ex. 5 | 1.0(B) | 0.5(B) |
| Ex. 6 | 1.5(B) | 0.6(B) |
| Ex. 7 | 2.0(B) | 0.8(B) |
| Ex. 8 | 1.5(B) | 1.0(B) |
| Ex. 9 | 1.5(B) | 1.0(B) |
| Ex. 10* | 10.0(C) | 4.0(C) |
| Ex. 11* | 3.0(C) | 6.0(C) |
| Ex. 12* | 1.5(B) | 1.5(B) |
| Ex. 13* | 1.5(B) | 1.5(B) |

TABLE 3

| | Thickness of release layer on end face of carrier (end-face thickness) (nm) | Chipping width of extremely-thin copper layer and other layers at side ends (mm) | Chemical penetration depth (mm) |
|---|---|---|---|
| Ex. 14 | 0 | 0(AA) | 0(AA) |
| Ex. 15 | 0.3 | 0(AA) | 0(AA) |
| Ex. 16 | 0.9 | 0.5(A) | 0.2(A) |
| Ex. 17 | 1.5 | 1.5(B) | 1.5(B) |
| Ex. 18 | 3 (The same thickness as that of surface layer) | 1.5(B) | 5.0(B) |

The invention claimed is:

1. A copper foil provided with a carrier, comprising:
   a carrier composed of glass;
   a release layer provided on the carrier;
   an antireflective layer provided on the release layer and composed of at least one metal selected from the group consisting of Cr, W, Ta, Ti, Ni and Mo; and
   an extremely-thin copper layer provided on the antireflective layer, a thickness thereof being 50-3,000 nm;
   wherein at least the surface adjacent to the extremely-thin copper layer of the antireflective layer comprises an aggregate of metal particles.

2. The copper foil provided with a carrier according to claim 1, wherein the surface adjacent to the extremely-thin copper layer of the antireflective layer is composed of an aggregate of the metal particles having a projected area circle equivalent diameter of 20 to 100 nm, determined by SEM image analysis.

3. The copper foil provided with a carrier according to claim 1, wherein the release layer mainly contains carbon.

4. The copper foil provided with a carrier according to claim 1, wherein the surface adjacent to the extremely-thin copper layer of the antireflective layer has a glossiness Gs (60°) of 500 or less.

5. The copper foil provided with a carrier according to claim 1, wherein the antireflective layer has a thickness of 1 to 500 nm.

6. The copper foil provided with a carrier according to claim 1, wherein the release layer has a thickness of 1 to 20 nm.

7. The copper foil provided with a carrier according to claim 1, wherein the surface remote from the release layer of the extremely-thin copper layer has an arithmetic average roughness Ra of 1.0 to 100 nm, measured in accordance with JIS B 0601-2001.

8. The copper foil provided with a carrier according to claim 1, wherein the antireflective layer has an oxygen content of 0 to 15 atom %.

9. The copper foil provided with a carrier according to claim 1, wherein at least the antireflective layer and the extremely-thin copper layer extend to end faces of the carrier and covers the end faces.

10. A method for manufacturing the copper foil according to claim 1, comprising:
   forming the release layer on the carrier;
   forming the antireflective layer on the release layer by magnetron sputtering with a metal target composed of at least one metal selected from the group consisting of Cr, W, Ta, Ti, Ni and Mo in an inert gas atmosphere under a pressure of 1 to 20 Pa; and
   forming the extremely-thin copper layer on the antireflective layer.

11. A method for manufacturing a coreless support provided with a wiring layer, comprising:
   providing the copper foil according to claim 1;
   forming a photoresist layer with a predetermined pattern on the surface of the extremely-thin copper layer;
   forming an electrolytic copper plating layer on the exposed surface of the extremely-thin copper layer;
   peeling off the photoresist layer; and
   removing an unnecessary portion of the extremely-thin copper layer by copper flash etching to expose the antireflective layer, thereby preparing the coreless support provided with a wiring layer.

12. The method according to claim 11, further comprising of image inspection of a coreless support provided with the wiring layer after the copper flash etching, while the antireflective layer remains exposed.

13. A method for manufacturing a printed wiring board, comprising:
   manufacturing the coreless support provided with a wiring layer by the method according to claim 12; and
   mounting an electronic element on the coreless support provided with the wiring layer after the image inspection.

14. A method for manufacturing a printed wiring board, comprising:
   manufacturing the coreless support provided with a wiring layer by the method according to claim 11;
   forming a build-up layer on a surface having the wiring layer of the coreless support provided with a wiring layer to prepare a laminate with a build-up layer;
   separating the laminate with a build-up layer at the release layer to prepare a multilayer wiring board including the build-up layer; and
   removing the antireflective layer by flash etching to prepare a printed wiring board.

15. A method for manufacturing a printed wiring board, comprising:
   manufacturing the printed wiring board by the method according to claim 13;
   forming a build-up layer on a surface having the wiring layer of the coreless support provided with a wiring layer to prepare a laminate with a build-up layer;
   separating the laminate with a build-up layer at the release layer to prepare a multilayer wiring board including the build-up layer; and
   removing the antireflective layer by flash etching to prepare a printed wiring board.

* * * * *